United States Patent
Karimi et al.

(10) Patent No.: US 12,244,414 B1
(45) Date of Patent: Mar. 4, 2025

(54) EARLY TERMINATION IN CONVOLUTIONAL LOW DENSITY PARITY CHECK DECODING

(71) Applicant: Infinera Corporation, San Jose, CA (US)

(72) Inventors: Mehdi Karimi, San Jose, CA (US); Han Henry Sun, San Jose, CA (US); Kuang-Tsan Wu, San Jose, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 17/367,161

(22) Filed: Jul. 2, 2021

Related U.S. Application Data

(60) Provisional application No. 63/048,540, filed on Jul. 6, 2020.

(51) Int. Cl.
*H03M 13/11* (2006.01)
*H04L 1/00* (2006.01)

(52) U.S. Cl.
CPC ....... *H04L 1/0057* (2013.01); *H03M 13/1102* (2013.01)

(58) Field of Classification Search
CPC .......................... H04L 1/0057; H03M 13/1102
USPC ....................................................... 714/726
See application file for complete search history.

(56) References Cited

U.S. PATENT DOCUMENTS

| | | | | |
|---|---|---|---|---|
| 6,212,656 B1* | 4/2001 | Fosco | ............ | G01R 31/318536 714/730 |
| 7,346,819 B2* | 3/2008 | Bansal | ............. | G01R 31/31716 714/716 |
| 8,335,881 B2* | 12/2012 | Welguisz | ................ | G06F 13/24 710/262 |
| 2008/0294953 A1* | 11/2008 | Cheng | .............. | G01R 31/31703 714/E11.155 |
| 2010/0103001 A1* | 4/2010 | Shokrollahi | ...... | H03M 13/3761 341/94 |
| 2010/0180168 A1* | 7/2010 | Ward | ............. | G01R 31/318566 714/E11.155 |
| 2013/0132791 A1* | 5/2013 | Alrod | ................. | H03M 13/1131 714/752 |
| 2015/0095726 A1* | 4/2015 | Cameron | ............. | H03M 13/118 714/704 |
| 2016/0020783 A1* | 1/2016 | Yang | .................. | H03M 13/1108 714/752 |
| 2019/0326931 A1* | 10/2019 | Liu | .................... | H03M 13/1148 |
| 2021/0328602 A1* | 10/2021 | Yoshida | ............. | H03M 13/152 |

FOREIGN PATENT DOCUMENTS

JP          2003198513 A  *  7/2003  ........ H03M 13/2975

* cited by examiner

*Primary Examiner* — Kyle Vallecillo
*Assistant Examiner* — Enam Ahmed
(74) *Attorney, Agent, or Firm* — Ken Rudofski

(57) ABSTRACT

Systems and methods for more efficiently decoding convolutional LDPC encoded communication signals are described. A decoder circuit iteratively determines the values of received data bits and confidence values corresponding to the determined data bit values. Using the confidence values and one or both of check fail counters and log likelihood ratio (LLR) sign changes, the decoder circuit can determine that a desired level of confidence has been satisfied and can subsequently terminate decoding operations to save power.

18 Claims, 6 Drawing Sheets

EARLY TERMINATION IN CONVOLUTIONAL LOW DENSITY PARITY CHECK DECODING

CROSS-REFERENCE TO RELATED APPLICATION

This application claims the benefit of U.S. Provisional Application No. 63/048,540, filed Jul. 6, 2020, which is incorporated herein by reference in its entirety.

FIELD

This specification generally relates to early termination of convolutional low density parity check (LDPC) decoders.

BACKGROUND

Convolutional low-density parity-check (LDPC) codes are widely used due to their outstanding performances under low complexity windowed decoder (also known as sliding window decoder). However, the design of low-cost low-power decoders remains challenging. One technique used to reduce the power in decoders for block LDPC codes is to terminate the decoding process when all the errors have been corrected. However, such a technique is difficult to use for convolutional LDPC codes because of the time constraints and dependencies applied to symbols used in convolutional coding.

SUMMARY

This disclosure describes systems, methods, devices, and other implementations for early termination of convolutional LDPC decoders to optimize power consumption.

To check for errors in coded data, a decoder circuit in an receiver can check a set of received data symbols adjacent in time that are directly related to a particular symbol, e.g., symbol S0, using parity check equations. If no issue is detected, the symbol S0 is assumed to be correct and a confidence value for symbol S0 is set to a maximum known value. The most significant bit (MSB) of S0 can be passed to help determine the final decoded output.

The decoder circuit check can be performed iteratively to determine the values of all the received data bits. After each iteration, the confidence value for each bit can be determined. Generally, by performing iterative checking, bit determination can improve and error can be reduced. However, after a certain number of iterations a desired threshold of confidence for processed bits may be achieved and additional iterations are not necessary. By terminating the iterations timely, power consumed by the decoder circuit can be reduced. Therefore, a method to determine when and how to terminate the iterations when using convolutional LDPC coding is desirable. Examples of such methods and systems are described hereinbelow.

In particular, this disclosure describes low complexity and low cost methods and systems for timely termination of decoder processing for LDPC codes using check fail counters and log likelihood ratio (LLR) sign change. One method utilizes check fail counters and log likelihood ratio (LLR) sign change whereas the other method utilizes check fail counters (no LLRs) and can save more power than the first method at a marginal cost on performance.

According to some implementations, a method includes a receiver receiving a communication signal comprising a plurality of symbols from a communication network. The symbols are provided to a decoder circuit of the receiver to decode the symbols. The method further includes determining whether a first subset of the symbols has an associated fail check count, and, in response to determining that the first subset of the symbols has no associated fail check count, configuring a termination parameter associated with the first subset of the symbols to have a first value. A value of a termination parameter associated with a second subset of the symbols is obtained. In response to the value of the termination parameter associated with the second subset of the symbols and the value of the termination parameter associated with the first subset of the symbols being the first value, the decoding of the symbols by the decoder circuit is terminated.

In some implementations, the second subset of symbols includes symbols that are received one clock cycle before the symbols in the first subset of symbols.

In some implementations, terminating the decoding of the symbols includes setting each log likelihood ratio value associated with the first subset of the symbols to a maximum value.

In some implementations, in response to determining that the first subset of the symbols has an associated fail check count, the termination parameter associated with the first subset of the symbols is configured to have a second value different from the first value. The second value indicates that decoding of the symbols by the decoder circuit should not be terminated.

In some implementations, in response to determining that the first subset of the symbols has no associated fail check count, signs of input log likelihood ratio values associated with the first subset of the symbols are compared to signs of output log likelihood ratio values associated with the first subset of the symbols. The termination parameter associated with the first subset of the symbols is configured to have the first value in response to determining that the signs of input log likelihood ratio values associated with the first subset of the symbols are identical to the signs of output log likelihood ratio values associated with the first subset of the symbols.

In some implementations, in response to determining that the first subset of the symbols has no associated fail check count, signs of input log likelihood ratio values associated with the first subset of the symbols are compared to signs of output log likelihood ratio values associated with the first subset of the symbols. The termination parameter associated with the first subset of the symbols is configured to have a second value in response to determining that the signs of input log likelihood ratio values associated with the first subset of the symbols are not identical to the signs of output log likelihood ratio values associated with the first subset of the symbols.

In some implementations, to decode the symbols, a base parity check matrix for the first subset of the symbols is configured, and a determination that a convolutional relationship between a first symbol and a second symbol received at different times matches a convolutional relationship utilized by a low-density parity-check (LDPC) encoder is made.

In some implementations, to decode the symbols, at each clock cycle, the decoder is configured to shift into the base parity check matrix an incoming group of symbols that arrived after a group of symbols in the base parity check matrix including the first subset of the symbols, and shift out of the base parity check matrix an outgoing group of symbols that were received earlier than remaining symbols in the base parity check matrix.

According to some implementations, a method includes a receiver receiving a communication signal comprising a plurality of symbols from a communication network. The symbols are provided to a decoder circuit of the receiver to decode the symbols. The method further includes determining whether a first subset of the symbols has an associated fail check count. In response to determining that the first subset of the symbols has no associated fail check count, signs of input log likelihood ratio values associated with the first subset of the symbols are compared to signs of output log likelihood ratio values associated with the first subset of the symbols, and the termination parameter associated with the first subset of the symbols is configured to have a first value in response to determining that the signs of input log likelihood ratio values associated with the first subset of the symbols are identical to the signs of output log likelihood ratio values associated with the first subset of the symbols. A value of a termination parameter associated with a second subset of the symbols is obtained. A decoding of the symbols is terminated by the decoder circuit in response to the value of the termination parameter associated with the second subset of the symbols and the value of the termination parameter associated with the first subset of the symbols being the first value.

In some implementations, in response to determining that the first subset of the symbols has no associated fail check count, signs of input log likelihood ratio values associated with the first subset of the symbols are compared to signs of output log likelihood ratio values associated with the first subset of the symbols. The termination parameter associated with the first subset of the symbols is configured to have a second value in response to determining that the signs of input log likelihood ratio values associated with the first subset of the symbols are not identical to the signs of output log likelihood ratio values associated with the first subset of the symbols.

In some implementations, to decode the symbols, a base parity check matrix for the first subset of the symbols is configured, and a determination that a convolutional relationship between a first symbol and a second symbol received at different times matches a convolutional relationship utilized by a low-density parity-check (LDPC) encoder is made.

In some implementations, to decode the symbols, at each clock cycle, the decoder is configured to shift into the base parity check matrix an incoming group of symbols that arrived after a group of symbols in the base parity check matrix including the first subset of the symbols, and shift out of the base parity check matrix an outgoing group of symbols that were received earlier than remaining symbols in the base parity check matrix.

In some implementations, the second subset of symbols includes symbols that are received one clock cycle before the symbols in the first subset of symbols.

According to some implementations, a receiver includes a receiver device and a processor. Several suitable receiver devices such as a laser/photo diode or an antenna, can be used. The receiver device is configured to receive a communication signal from a communication network. The communication signal includes a plurality of symbols. The processor includes a decoder coupled to the receiver antenna. The processor is configured to decode the symbols by determining values of data bits mapped to the symbols, determining that a confidence threshold associated with decoding the symbols is satisfied before performing the particular number of iterations, and terminating the decoding of the symbols in response to determining that a confidence threshold associated with decoding the symbols is satisfied. The decoder is configured to determine the values of the data bits for a particular number of iterations;

In some implementations, the decoding of the symbols is terminated before all the particular number of iterations have been performed.

In some implementations, to determine that the confidence threshold associated with decoding the symbols is satisfied before performing the particular number of iterations, the processor is configured to perform operations for two or more iterations. The operations include determining whether a first subset of the symbols has an associated fail check count, configuring a termination parameter associated with the first subset of the symbols to have a first value in response to determining that the first subset of the symbols has no associated fail check count, and obtaining a value of a termination parameter associated with a second subset of the symbols.

In some implementations, terminating the decoding of the symbols includes terminating the decoding of the symbols in response to the value of the termination parameter associated with the second subset of the symbols and the value of the termination parameter associated with the first subset of the symbols being the first value.

In some implementations, the second subset of symbols includes symbols that are received one clock cycle before the symbols in the first subset of symbols.

In some implementations, terminating the decoding of the symbols includes setting each log likelihood ratio value associated with the first subset of the symbols to a maximum value.

In some implementations, to determine that the confidence threshold associated with decoding the symbols is satisfied before performing the particular number of iterations, the processor is configured to perform operations for two or more iterations. The operations include comparing signs of input log likelihood ratio values associated with the first subset of the symbols to signs of output log likelihood ratio values associated with the first subset of the symbols, in response to determining that the first subset of the symbols has no associated fail check count; and configuring the termination parameter associated with the first subset of the symbols to have the first value in response to determining that the signs of input log likelihood ratio values associated with the first subset of the symbols are identical to the signs of output log likelihood ratio values associated with the first subset of the symbols.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
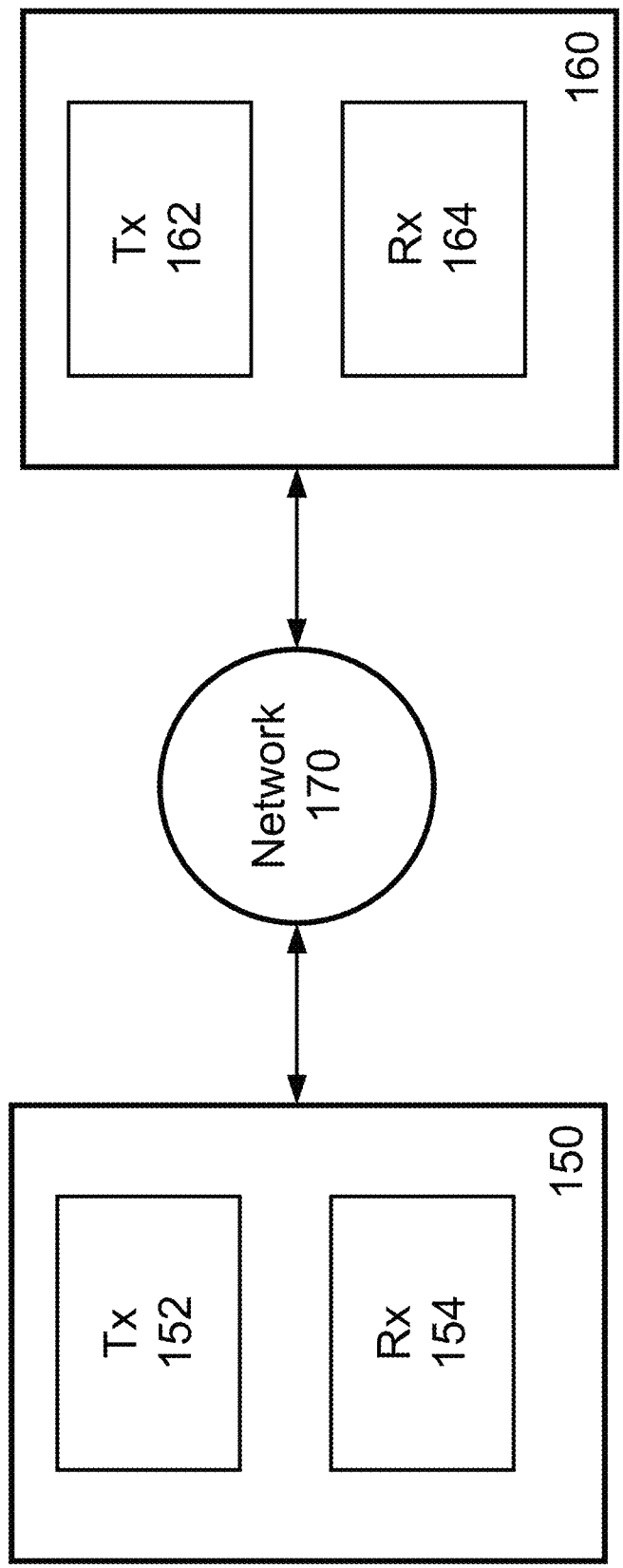
FIG. 1 depicts an example of a communication system.

FIG. 1 depicts an example communication system in which two devices 150, 160 are configured to communicate with each other over a communication network 170.

Each of device 150 and 160 may be an electronic device configured to communicate over a wired and/or wireless network such as communication network 170. This electronic device may be a portable or non-portable device. In some implementations, devices 150 and 160 can include, but are not limited to, lasers, optical sub-assemblies, original equipment manufacturer (OEM) modules, optical transceivers, sensors, switches, filters, detectors, emitters, and amplifiers.

Device 150 can include a transmitter (Tx) 152 to transmit data to other devices, e.g., device 160, using the communication network 170. Device 150 can also include a receiver (Rx) 154 to receive data from other devices, e.g., device 160, via the communication network 170. Similarly, device 160 can include a transmitter (Tx) 162 to transmit data to other devices, e.g., device 150, through communication network 170, and a receiver (Rx) 164 to receive data from other devices, e.g., device 150, via communication network 170. For example, Tx 152 can transmit one or more modulated communication signals to Rx 164 through a communication path in the communication network 170. Devices 150 and 160 include various components such as memory devices and processors to process data to be sent and/or received over the communication network. Transmitters Tx 152, Tx 162 and receivers Rx 154, 164 can include antennas and supporting components such as amplifiers and filters to implement the communications.

The communication network 170 can be a wired and/or wireless network to facilitate communication between multiple electronic devices or components. In some implementations, the communication network 170 can include an optical communication network with optical fiber cables that enable transmission of data in the form of light signals between multiple network nodes and devices, such as devices 150 and 160. The communication network can include various components and devices to facilitate the transmission of data across the network. These devices include, for example, amplifiers to amplify a modulated communication signal at various locations along a communication path in the communication network.

Figure 2:
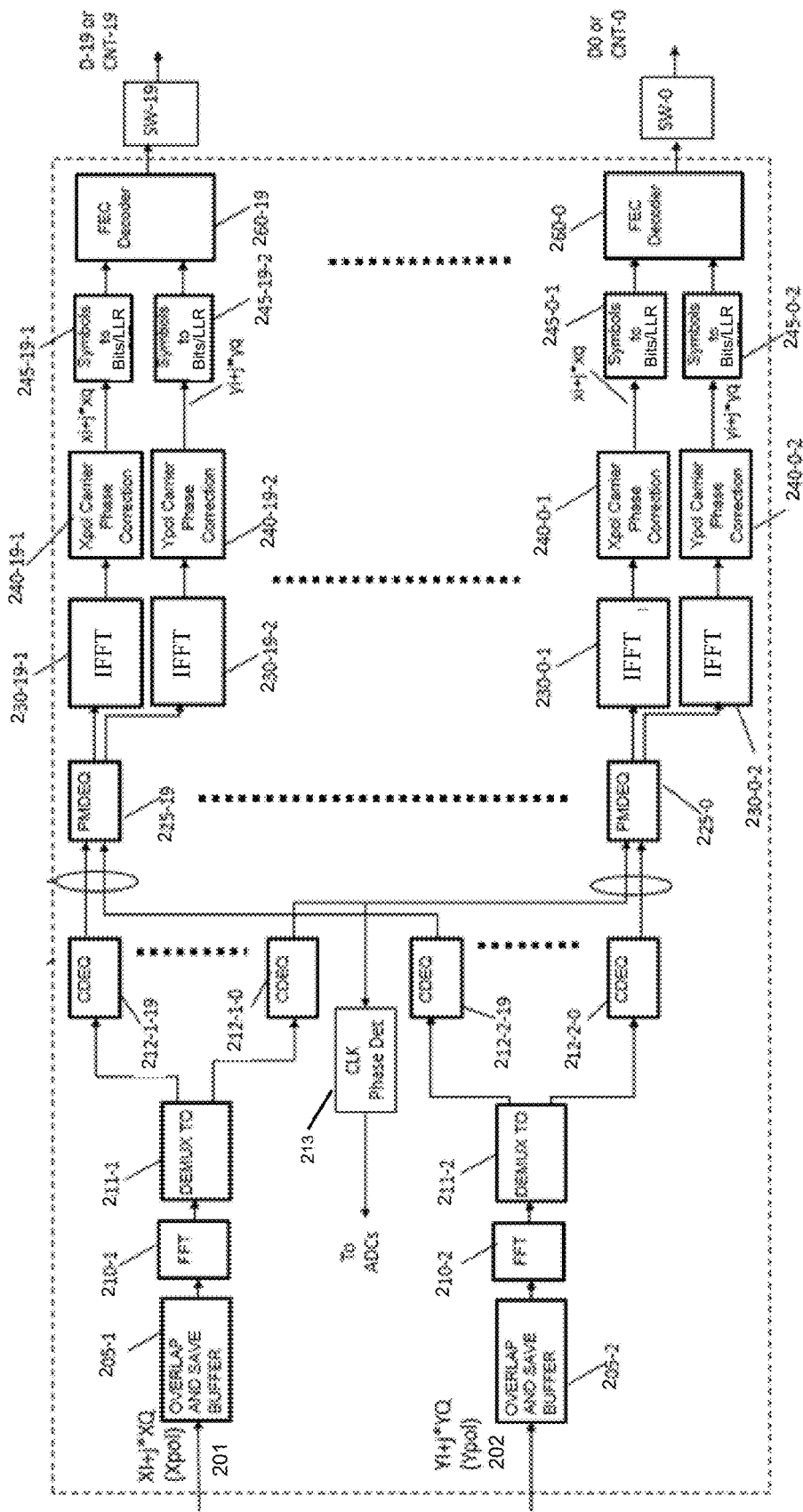
FIG. 2 depicts an example of a processor in a receiver.

FIG. 2 illustrates an exemplary implementation of a Rx processor included in a receiver such as Rx 154 or 164. While the Rx processor 200 in FIG. 2 is described below according to certain functional components, in some implementations, the Rx processor 200 can include additional functional components, fewer functional components, different functional components, or differently arranged functional components. FIG. 2 depicts an example implementation of a Rx processor 200 with several components. However, not all the components are necessary and some components, such as the symbols-to-bits/LLR circuits, may optionally be included or excluded. Furthermore, the components of the Rx processor 200 can be arranged in various ways while processing a received signal and using the LPDC decoding described herein. Accordingly, the implementation illustrated in FIG. 2 is merely one example of a receiver system that can execute the LPDC decoding for power optimization described herein.

Referring to FIG. 2, a signal that can include multiple subcarriers can be received from a network such as network 170. The received signal can be received by one or more antennas (not shown) and processed by one or more analog-to-digital circuits ADCs (not shown) that are configured to output digital samples of the received analog signal. In one example, the samples can be supplied by each ADC at a rate of 64 GSamples/s. The digital samples may correspond to symbols carried by the X polarization of the subcarriers and can be represented by the complex number $XI=jXQ$ 201.

The digital samples can be provided to one or more overlap and save buffer(s) 205, as shown in FIG. 2. One or more FFT component(s) or circuit(s) 210 can receive the vector elements from the overlap and save buffer(s) 205 and convert the vector elements to the frequency domain using, for example, a fast Fourier transform (FFT). One or more FFT component(s) 210-1 can convert the vector elements to frequency components, each of which can be stored in a register or "bin" or other memory, as a result of carrying out the FFT.

The frequency components can be demultiplexed by one or more demultiplexers 211-1, and groups of such components can be supplied to m respective chromatic dispersion equalizer circuit(s) CDEQ 212-1-0 to 212-1-$m$, each of which can include a finite impulse response (FIR) filter that corrects, offsets or reduces the effects of, or errors associated with, chromatic dispersion of the transmitted subcarriers. In the figures and subsequent description m equals the number of subcarriers. For the purposes of this example, the number of subcarriers is nineteen (9).

Each of CDEQ circuit(s) 212-1-0 to 212-1-19 supplies an output to a corresponding polarization mode dispersion (PMD) equalizer circuit 225-0 to 225-19 (which individually or collectively can be referred to as PMDEQs 225). Without loss of generality, PMD equalization can be done in frequency domain as shown in FIG. 2 or it can be done in time domain after IFFT(s) 230 and before carrier phase correction (CPCs 240).

Digital samples output from ADC(s) associated with Y polarization components 202 of a received signal can be processed in a similar manner to that of digital samples output from ADC(s) associated with the X polarization component of the received signal. Namely, overlap and save buffer 205-2, FFT 210-2, demultiplexer 211-2, and CDEQ circuits 212-2-0 to 212-2-19 can have a similar structure and operate in a similar fashion as buffer 205-1, FFT 210-1, demultiplexer 211-1, and CDEQ circuits 212-1-0 to 212-1-19, respectively. For example, each of CDEQ circuits 212-2-0 to 212-19 can include an FIR filter that corrects, offsets, or reduces the effects of, or errors associated with, chromatic dispersion of the transmitted subcarriers. In addition, each of CDEQ circuits 212-2-0 to 212-2-19 provide an output to a corresponding one of PMDEQ 225-0 to 225-19.

The output of one of the CDEQ circuits, such as CDEQ 212-1-0, can be supplied to clock phase detector circuit 213 to determine a clock phase or clock timing associated with the received subcarriers. Such phase or timing information or data can be supplied to ADCs to adjust or control the timing of the digital samples output from the ADCs.

Each of PMDEQ circuits 225 can include another FIR filter that corrects, offsets or reduces the effects of, or errors associated with, PMD of the transmitted subcarriers. Each of PMDEQ circuits 225 can supply a first output to a respective one of IFFT components or circuits 230-0-1 to 230-19-1 and a second output to a respective one of IFFT components or circuits 230-0-2 to 230-19-2, each of which can convert a 256-element vector, in this example, back to the time domain as 256 samples in accordance with, for example, an inverse fast Fourier transform (IFFT).

Time domain signals or data output from IFFT 230-0-1 to 230-19-1 are supplied to a corresponding one of Xpol carrier phase correction circuits 240-0-1 to 240-19-1, which can apply carrier recovery techniques. In some implementations, each carrier phase correction circuit 240-0-1 to 240-19-1 can compensate or correct for frequency and/or phase differences between the X polarization of the transmit signal and the X polarization of light from a local oscillator in the receiver based on an output of Xpol carrier recovery circuits 240-0-1 to 240-19-1, which performs carrier recovery in connection with one of the subcarrier based on the outputs of IFFTs 230-0-1 to 230-19-1. After such X polarization carrier phase correction, the data associated with the X polarization component can be represented as symbols having the complex representation xi+j*xq in a constellation, such as a QPSK constellation or a constellation associated with another modulation formation, such as an m-quadrature amplitude modulation (QAM), m being an integer. In some implementations, the taps of the FIR filter included in one or more of PMDEQ circuits 225 can be updated based on the output of at least one of carrier phase correction circuits 240-0-1 to 240-19-01.

In a similar manner, time domain signals or data output from IFFT 230-0-2 to 230-19-2 are supplied to a corresponding one of Ypol carrier phase correction circuits 240-0-2 to 240-19-2, which can apply carrier recovery techniques. In some implementations, each carrier phase correction circuit 240-0-2 to 240-19-2 also can correct or compensate for frequency and/or phase differences between the Y polarization of the transmit signal and the Y polarization of light from the receiver's local oscillator. After such Y polarization carrier phase correction, the data associated with the Y polarization component can be represented as symbols having the complex representation yi+j*yq in a constellation, such as a QPSK constellation or a constellation associated with another modulation formation, such as an m-quadrature amplitude modulation (QAM), m being an integer. In some implementations, the output of one of circuits 240-0-2 to 240-19-2 can be used to update the taps of the FIR filter included in one or more of PMDEQ circuits 225 instead of, or in addition to, the output of at least one of the carrier recovery circuits 240-0-1 to 240-19-1.

The equalizer, carrier recovery, and clock recovery can be further enhanced by utilizing the known (training) bits that can be included in control signals CNT, for example by providing an absolute phase reference between the transmitted and local oscillator lasers.

In some implementations, one or more symbols-to-bits/LLR circuits or components 245-0-1 to 245-19-1 can be included in the Rx processor 200. In such implementations, each of the symbols-to-bits/LLR circuits or components 245-0-1 to 245-19-1 can receive the symbols output from a corresponding one of circuits 240-0-1 to 240-19-1 and map the symbols back to bits. For example, each of the symbol-to-bits components 245-0-1 to 245-19-1 can demap one X polarization symbol, in a QPSK or m-QAM constellation, to Z bits, where Z is an integer. For dual-polarization QPSK modulated subcarriers, Z is two. Bits output from each of component 245-0-1 to 245-19-1 are provided to a corresponding one of FEC decoder circuits 260-0 to 260-19.

Y polarization symbols are output from a respective one of circuits 240-0-2 to 240-19-2, each of which has the complex representation yi+j*yq associated with data carried by the Y polarization component. Each Y polarization, like the X polarization symbols noted above, can be provided to a corresponding one of bit-to-symbol circuits or components 245-0-2 to 245-19-2, each of which has a similar structure and operates in a similar manner as symbols-to-bits/LLR component 245-0-1 to 245-19-1. Each of circuits 245-0-2 to 245-19-2 can provide an output to a corresponding one of FEC decoder circuits 260-0 to 260-19.

Each of FEC decoder circuits 260 can remove errors in the outputs of symbol-to-bit circuits 245 using, for example, forward error correction. Such error corrected bits, which can include user data, can be supplied to a corresponding one of switch circuits SW-0 to SW-19. Switch circuits SW-0 to SW-19 in each secondary node 112 can selectively supply or block data based on whether such data is intended to be output from a particular node.

In general, several types of decoders can be used in the Rx processor 200. In some implementations, the decoder circuits 260 can operate to decode low density parity check convolutional (LDPC) codes. LDPC convolutional codes can generally be characterized using sparse parity-check matrices, which allow the codes to be decoded using iterative message-passing algorithms. LDPC convolutional codes are capable of achieving excellent performance with low encoding and decoding complexity.

Figure 3:
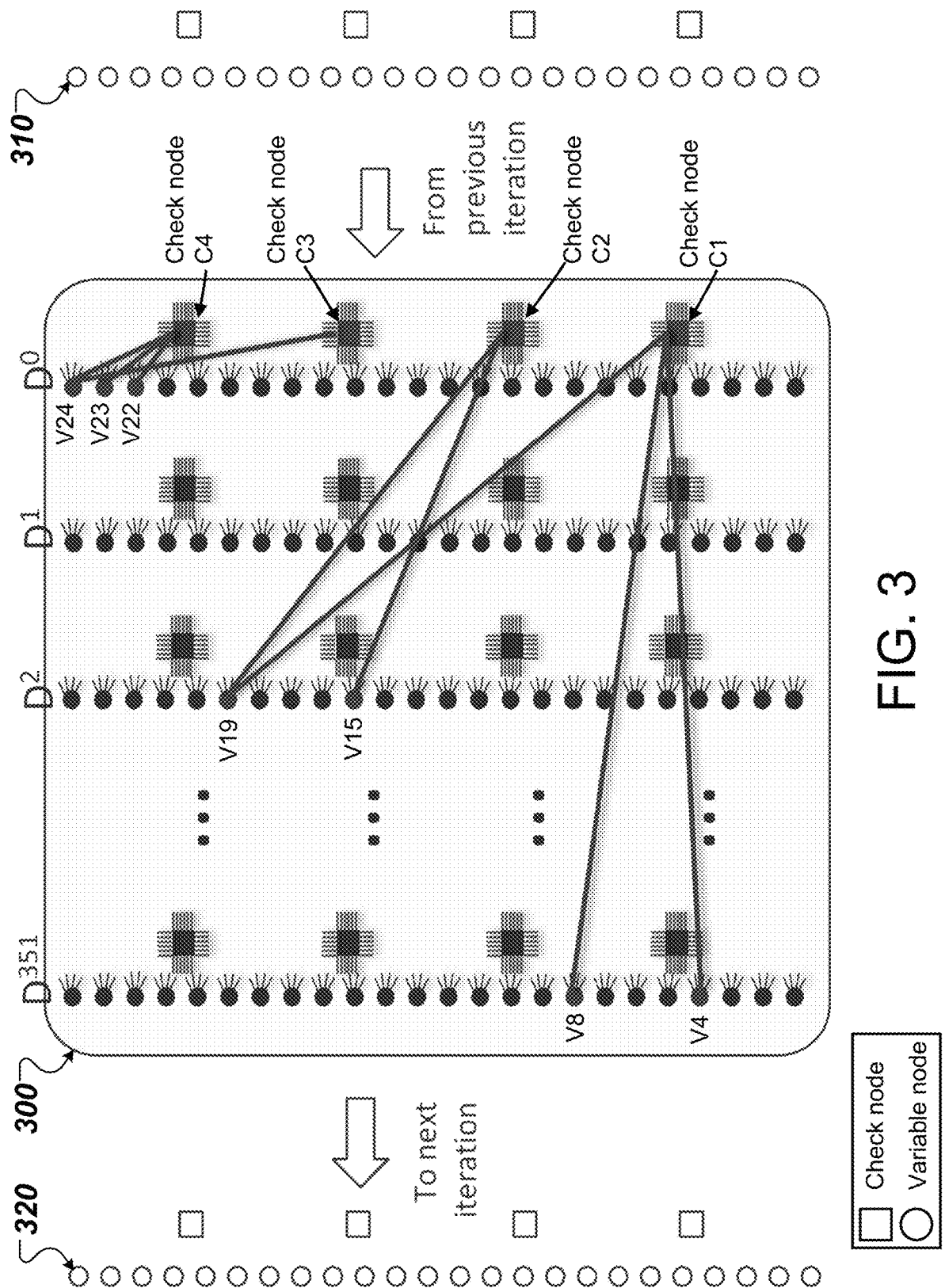
FIG. 3 depicts an example of processing convolutional LPDC encoded data using a base parity check matrix.

FIG. 3 illustrates an example of one iteration of symbols being processed using an example convolutional LPDC decoding method. FIG. 3 depicts a 4×24 base parity check matrix 300 with a constraint length of 352. At each clock cycle, 24 incoming symbols 310 enter the matrix 300 and 24 outgoing symbols 320 exit the matrix 300. As each new set of 24 symbols is received, symbols are transferred over to the subsequent set of variable nodes at each clock cycle. For example, symbols at constraint column $D_0$ are transferred to constraint column $D_1$; symbols at constraint column $D_1$ are transferred to constraint column $D_2$. This transfer of data at every iteration is repeated until a set of symbols reaches constraint column $D_{351}$. At the next iteration, symbol data from constraint column $D_{351}$ is transferred out of the base parity check matrix 300.

Accordingly, data in constraint column $D_0$ represents data that was most recently received by the decoder circuit 260; data in constraint column $D_1$ represents data that was received one clock cycle earlier by the decoder circuit 260; and data in constraint column $D_2$ represents data that was received two clock cycles earlier by the decoder circuit 260. Accordingly, the matrix 300 or decoder block shown in FIG. 3 is an example in which data over 352 clock cycles is processed at the same time. Data in each constraint column can also include a parity bit.

The square/rectangular symbol "□" refers to a check node, and the circular symbol "○" refers to a variable node. The variable nodes send their LLRs to the check nodes connected to them, the check nodes evaluate the parity check equation, calculate, and send messages to the variable nodes. The variable nodes then update their LLRs based on the received messages.

In more detail, each constraint column has a set of four check nodes that represent a checking operation performed by the decoder circuit 260. The checking operation involves the checking node checking the relationship between different symbols in the base parity check matrix 300. Information regarding the relationship between different symbols in the base parity check matrix 300 is provided from an encoder in a transmitter to the decoder circuit 260.

For example, in FIG. 3, check node C1 in constraint column $D_0$ can check the relationships between symbols at variance nodes V4 and V8 in constraint column D351, and symbol at variance node V19 in constraint column D2. Check node C2 in constraint column Do can check the relationships between symbols at variance nodes V15 and V19 in constraint column $D_2$. Check node C3 in constraint column Do can check the symbol at variance node V24 in constraint column $D_0$. Check node C4 in constraint column Do can check the relationships between symbols at variance nodes V22-V24 in constraint column $D_0$. Check nodes associated with each of the other constraint columns can similarly perform checking operations on other symbols. In this manner, the relationships between various symbols can be verified based on the convolutional relationship deployed by the transmitter's encoder.

In general, different techniques can be used to check the relationships between symbols at two or more variance nodes. In some implementations, a check node can perform a logical XOR operation of the symbol values at the two or more variance nodes. If the result of the XOR operation, or more generally the checking operation, is consistent with the expected result based on the convolutional relationship information provided the transmitter's encoder, the check node can increase the confidence level associated with each of the symbols that were checked. If the result of the XOR operation, or more generally the checking operation, is not consistent with the expected result, the check node decreases the confidence level associated with each of the symbols that were checked.

A LLR value representative of the log of a probability that a bit is zero over a probability that the bit is one can be used to reflect the confidence level. As a result of the checking operation described above, the LLR value can be increased or decreased by a predetermined amount, e.g., 5%, to reflect a successful or unsuccessful outcome of the checking operation.

For instance, a symbol at one of the variable nodes can have a LLR value of X. After a successful checking operation, the LLR value of the bit can be increased to 1.05X. After an unsuccessful checking operation, the LLR value can be decreased to 0.95X. In this manner, after each checking operation iteration, the LLR value associated with a bit can be reflective of the decoder's confidence that a bit's value has been correctly determined.

When all the LLR values for the bits and symbols in the base parity check matrix 300 satisfy a threshold, then the decoder circuit 260 can determine that the fail check counters associated with all the symbols of the particular iteration are zero. When there are one or more LLR values for bits and/or symbols in the base parity check matrix 300 that do not satisfy a threshold, then the decoder circuit 260 assigns a non-zero fail check counter to the symbol or bit that did not satisfy the threshold. Here, satisfying the threshold refers to the LLR value for a bit and/or symbol being greater than or equal to the threshold value.

The above-described processing of symbols and bits in a base parity check matrix 300 by decoder circuit 260 is repeated for multiple iterations until data received in a signal is fully processed. An example of the multiple iterations is shown in FIG. 6. The fail check counters are used to determine when to terminate processing by the decoder circuit 260 as described in more detail below with respect to FIGS. 4 and 5.

FIG. 6 illustrates a multiple iteration example in which three variable nodes 605, 610, 615 and two check nodes 620, 625 form a 2×3 base parity check matrix. The constraint length is three (three constraint columns $D^1$, $D^2$, $D^3$ are shown). For each clock cycle in this example, 3 symbols enter the base parity check matrix or are received for further processing from an earlier iteration, and 3 symbols leave the base parity check matrix or are sent for further processing to the next iteration. An indication of the convolutional nature of the coding is shown in which check nodes from one iteration are connected to variable nodes from a previous or subsequent iteration. For example, variable node 610 in iteration n is connected to a check node 625 from an earlier iteration.

As described above, variable nodes can send their LLRs to the check nodes connected to them. The check nodes can evaluate the parity check equation, calculate and send out messages back to the variable nodes. The variable nodes can update their LLRs based on the received messages.

Figure 4:
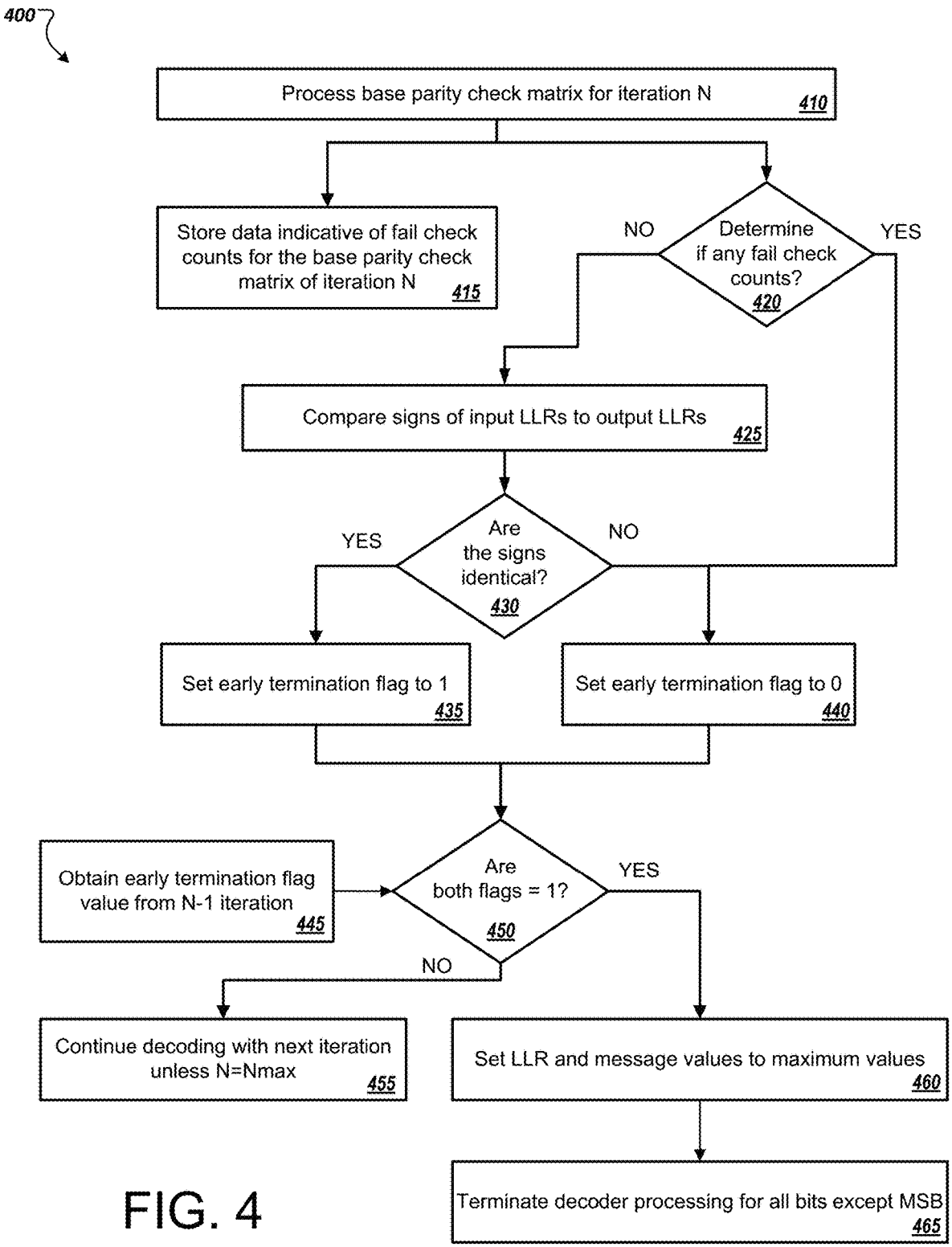
FIG. 4 depicts a flowchart of an example power optimization method used to determine when to terminate decoding operations in a decoder circuit.
Figure 5:
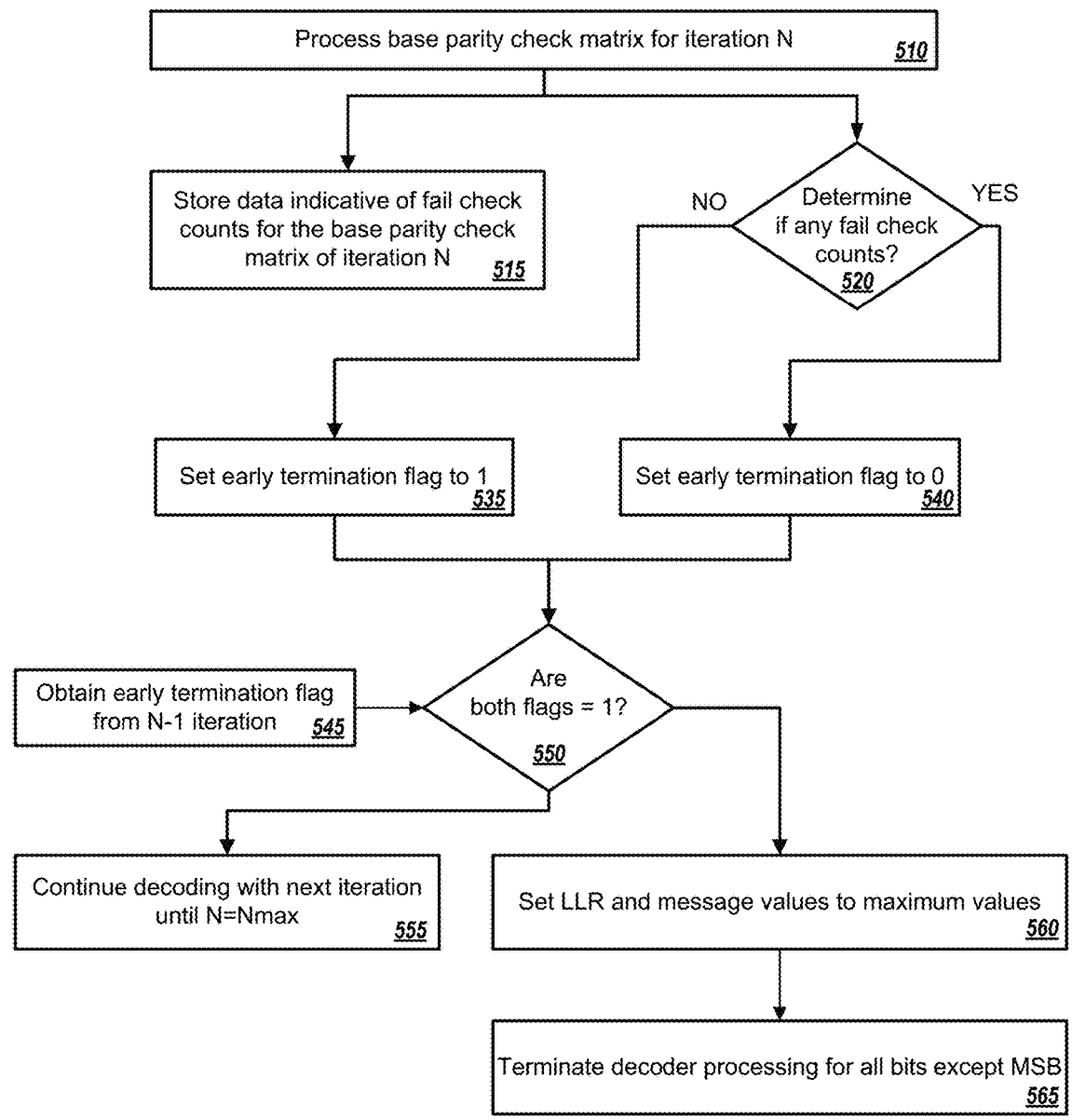
FIG. 5 depicts a flowchart of a second example power optimization method used to determine when to terminate decoding operations in a decoder circuit.
Figure 6:
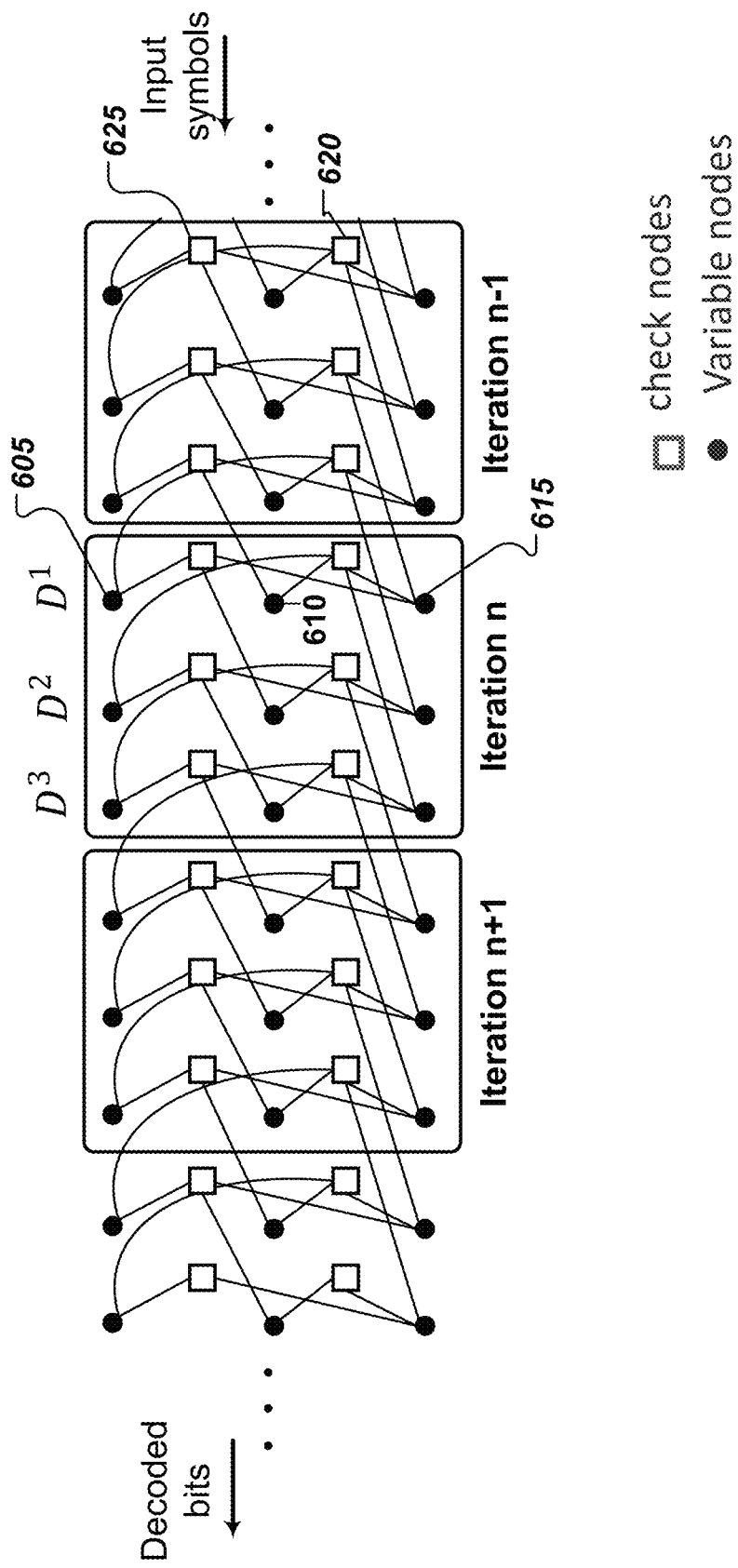
FIG. 6 depicts an example diagram of multiple decoding iterations.

FIGS. 4 and 5 illustrate example flowcharts of two power optimization methods 400, 500 used to determine when to terminate decoding operations performed by a receiver Rx processor that includes one or more decoder circuits such as decoder circuit 260. FIGS. 4 and 5 illustrate a set of operations that is performed for a particular iteration of data processing by a decoder circuit. This set of operations can be repeated for multiple iterations.

Referring to FIG. 4, in operation 410, a base parity check matrix 300 for a particular iteration N can be processed by implementing the operations described above with respect to FIG. 3. After the processing, data indicating fail check counts for particular symbols and/or bits processed for iteration N are stored (operation 415). As described above, the fail check count for a symbol and/or bit indicate whether the LLR value for a particular bit and/or symbol in the base parity check matrix 300 satisfies a threshold.

After processing the base parity check matrix 300, the decoder circuit can determine if the base parity check matrix 300 includes any fail check counts (operation 420). If there are one or more fail check counts, the decoder circuit can set the early termination flag for iteration N to zero (operation 440). Setting an early termination flag to zero is an indication that the decoder circuit should not terminate processing.

If there is not a single fail check count, the decoder circuit can compare the signs of the input LLRs and the output LLRs (operation 425). Input LLRs may refer to the LLR values associated with symbols and/or bits as they enter the base parity check matrix 300 for iteration N. Output LLRs may refer to the LLR values associated with symbols and/or bits as they exit the base parity check matrix 300 for iteration N. Operation 425 is performed to determine if the LLR for a particular symbol and/or bit has changed during the processing of the base parity check matrix 300 for iteration N. If the signs for the input LLRs and the output LLRs are identical (operation 430), this suggests that the signs for the LLR values have not changed during the processing of the base parity check matrix 300 for iteration N. In response, the decoder circuit can set the early termination flat for iteration N to 1 (operation 435).

If the signs for the input LLRs and the output LLRs are not identical (operation 430), this suggests that the signs for the LLR values are likely to have changed during the processing of the base parity check matrix 300 for iteration N. In response, the decoder circuit can set the early termination flag for iteration N to 0 (operation 440).

The decoder circuit can determine how to configure an early termination flag associated with a particular iteration by performing operations 410 to 440 in the manner described above. However, because convolutional LDPC coding involves a complex relationship between bits encoded at different times, the decoder circuit performs some additional steps before terminating the decoding operations to save power.

In particular, after setting the value for the early termination flag for iteration N, the decoder circuit can obtain the early termination flag value for the prior (N-1) iteration (operation 445). The early termination flag value can be obtained from a memory coupled to or integrated with the Rx processor. When N=1 (the first iteration), the early termination flag associated with the N-1 (prior) iteration is set to zero by default.

Next, the decoder circuit can compare the early termination flag values for iteration N and N-1 to determine if both flag values are equal to one (operation 450). If both flag values are one, this suggests that there have been at least two iterations for which satisfactory LLR values were determined for all processed symbols and/or bits. This occurrence further suggests that the received and processed data has an acceptable level of noise and can therefore be further processed.

In response to determining that the early termination flag values for iteration N and N-1 are equal to one, the decoder circuit can set the LLR and message values to the maximum values (operation 460) and can terminate decoder processing of data bits in a received signal except for the most significant bits (MSBs) (operation 465). In some implementations, this can be done by turning off the clock signal for such processing. Message values are included in messages sent from a check node to a variable node to update the LLR. For example, if a LLR value decreased from X to 0.95X, a message including a message value of 0.05X may be sent to a variable node associated with the check node. The maximum LLR value generally refers to the maximum bits used to represent an LLR or Message value, and can vary based on the receiver system being used.

If either the early termination flag value for iteration N or the early termination flag value for iteration N-1 is not equal to one, the decoder circuit will continue its decoding operation for the next iteration (operation 455). LLR and message values for the current iteration N may be stored so that they can be recalled for processing of the next iteration. If iteration N is the last one, then the decoder circuit will terminate its operations.

FIG. 5 depicts a flowchart of another power optimization method 500 used to determine when to terminate decoding operations. The operations shown in FIG. 5 are similar to the operations shown in FIG. 4 except that operations 425 and 430 (comparing the signs of the input and output LLRs to determine if the signs are identical) are not performed.

In FIG. 5, if the base parity check matrix 300 for iteration N includes one or more fail check counts, the decoder circuit can set the early termination flag for iteration N to zero (operation 540) like in FIG. 4. However, if there is not a single fail check count, the decoder circuit can then set the early termination flat to one (operation 535). Subsequent operations (operations 545 to 565) can be performed in a similar manner as operations 445 to 465 as described with respect to FIG. 4.

The methods described above in FIGS. 3-5 allow a decoder circuit to save power by determining when to stop decoding convolutional LDPC codes. The method depicted in FIG. 4 has an advantage in that it helps save power while having no impact on the bit error rate (BER) of the decoder circuit. Power saving of the decoder circuit can be dependent on two factors, namely the input signal-to-noise ratio and the number of iterations that the decoder circuit utilizes to process received data. For an LDPC code with 12 iterations, and an input SNR of FEC threshold to FEC_threshold+ 0.5dB, the method described with respect to FIG. 4 can reduce the number of iterations by a count of two (2) to seven (7), and can save power for performing two (2) to seven (7) iterations. The method described with respect to FIG. 5 can reduce power in a similar manner but may conduct approximately 1 more iteration on average than the method described with respect to FIG. 4.

While this specification contains many specifics, these should not be construed as limitations on the scope of the disclosure or of what may be claimed, but rather as descriptions of features specific to particular implementations. Certain features that are described in this specification in the context of separate implementations may also be combined. Conversely, various features that are described in the context of a single implementation may also be implemented in multiple implementations separately or in any suitable sub-combination. Moreover, although features may be described above as acting in certain combinations and may even be claimed as such, one or more features from a claimed combination may, in some cases, be excised from the combination, and the claimed combination may be directed to a sub-combination or variation of a sub-combination. For example, although the mapping operation is described as a series of discrete operations, the various operations may be divided into additional operations, combined into fewer operations, varied in order of execution, or eliminated, depending on the desired implementation. Similarly, the separation of various system components in the implementations described above should not be understood as requiring such separation in all implementations.

Terms used herein and in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together. The term "and/or" is also intended to be construed in this manner.

The use of the terms "first," "second," "third," etc., are not necessarily used herein to connote a specific order or number of elements. Generally, the terms "first," "second," "third," etc., are used to distinguish between different elements as generic identifiers. Absent a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

What is claimed is:

1. A method comprising:
   receiving, by a receiver, a communication signal comprising a plurality of symbols from a communication network;
   providing the symbols to a decoder circuit of the receiver to decode the symbols;
   determining whether a first subset of the symbols has an associated first fail check count, the first fail check count being based on first log likelihood ratio values in a base parity check matrix, the first log likelihood ratio values being associated with the first subset of the symbols;
   in response to determining that the first subset of the symbols has no associated first fail check count based on the first log likelihood values, configuring a first termination parameter associated with the first subset of the symbols to have a first value;
   determining whether a second subset of the symbols has an associated second fail check count, the second fail check count being based on second log likelihood ratio values in the base parity check matrix, the second log likelihood ratio values being associated with the second subset of the symbols;
   in response to determining that the second subset of the symbols has no associated second fail check count based on the second log likelihood ratio value, configuring a second termination parameter associated with the second subset of the symbols to have a second value; and
   terminating a decoding of the symbols by the decoder circuit in response to the second value of the second termination parameter associated with the second subset of the symbols and the first value of the first termination parameter associated with the first subset of the symbols being identical.

2. The method of claim 1, wherein the second subset of symbols includes symbols that are received one clock cycle before the symbols in the first subset of symbols.

3. The method of claim 1, wherein terminating the decoding of the symbols comprises:
   setting the first log likelihood ratio value associated with the first subset of the symbols to a maximum value.

4. The method of claim 1, comprising:
   in response to determining that the first subset of the symbols has the associated first fail check count, configuring the first termination parameter associated with the first subset of the symbols to have a third value different from the first value, the third value indicating that decoding of the symbols by the decoder circuit should not be terminated.

5. The method of claim 1, comprising:
   in response to determining that the first subset of the symbols has no associated first fail check count, comparing signs of the first log likelihood ratio values associated with the first subset of the symbols to signs of output log likelihood ratio values associated with the first subset of the symbols; and
   configuring the first termination parameter associated with the first subset of the symbols to have the first value in response to determining that the signs of the first log likelihood ratio values associated with the first subset of the symbols are identical to the signs of output log likelihood ratio values associated with the first subset of the symbols.

6. The method of claim 1, comprising:
   in response to determining that the first subset of the symbols has no associated first fail check count, comparing signs of first log likelihood ratio values associated with the first subset of the symbols to signs of output log likelihood ratio values associated with the first subset of the symbols; and
   configuring the first termination parameter associated with the first subset of the symbols to have a third value in response to determining that the signs of first log likelihood ratio values associated with the first subset of the symbols are not identical to the signs of output log likelihood ratio values associated with the first subset of the symbols.

7. The method of claim 1, wherein to decode the symbols comprises:
   configuring the base parity check matrix for the first subset of the symbols; and
   determining that a convolutional relationship between a first symbol and a second symbol of the symbols received at different times matches a convolutional relationship utilized by a low-density parity-check (LDPC) encoder.

8. The method of claim 7, wherein to decode the symbols, at each clock cycle, the decoder circuit is configured to:
   shift into the base parity check matrix an incoming group of symbols that arrived after a group of symbols in the base parity check matrix including the first subset of the symbols; and
   shift out of the base parity check matrix an outgoing group of symbols that were received earlier than remaining symbols in the base parity check matrix.

9. A method comprising:
   receiving, by a receiver, a communication signal comprising a plurality of symbols from a communication network;
   providing the symbols to a decoder circuit of the receiver to decode the symbols;
   determining whether a first subset of the symbols has an associated fail check count;
   in response to determining that the first subset of the symbols has no associated fail check count:
      comparing signs of input log likelihood ratio values associated with the first subset of the symbols to signs of output log likelihood ratio values associated with the first subset of the symbols; and
      configuring a termination parameter associated with the first subset of the symbols to have a first value in response to determining that the signs of input log likelihood ratio values associated with the first subset of the symbols are identical to the signs of output log likelihood ratio values associated with the first subset of the symbols, obtaining a value of a termination parameter associated with a second subset of the symbols; and terminating a decoding of the symbols by the decoder circuit in response to the value of the termination parameter associated with the second subset of the symbols and the value of the termination parameter associated with the first subset of the symbols being the first value.

10. The method of claim 9, comprising:

in response to determining that the first subset of the symbols has no associated fail check count, comparing signs of input log likelihood ratio values associated with the first subset of the symbols to signs of output log likelihood ratio values associated with the first subset of the symbols; and configuring the termination parameter associated with the first subset of the symbols to have a second value in response to determining that the signs of input log likelihood ratio values associated with the first subset of the symbols are not identical to the signs of output log likelihood ratio values associated with the first subset of the symbols.

11. The method of claim 9, wherein to decode the symbols comprises:

configuring a base parity check matrix for the first subset of the symbols; and determining that a convolutional relationship between a first symbol and a second symbol received at different times matches a convolutional relationship utilized by a low-density parity-check (LDPC) encoder.

12. The method of claim 11, wherein to decode the symbols, at each clock cycle, the decoder circuit is configured to:

shift into the base parity check matrix an incoming group of symbols that arrived after a group of symbols in the base parity check matrix including the first subset of the symbols; and shift out of the base parity check matrix an outgoing group of symbols that were received earlier than remaining symbols in the base parity check matrix.

13. The method of claim 9, wherein the second subset of symbols includes symbols that are received one clock cycle before the symbols in the first subset of symbols.

14. A receiver configured to receive a communication signal from a communication network, the communication signal comprising a plurality of symbols, the receiver comprising:

a processor comprising a decoder, the processor being configured to decode the symbols by:

determining values of data bits mapped to the symbols, the decoder being configured to determine the values of the data bits for a particular number of iterations;

determining that a confidence threshold associated with decoding the symbols is satisfied before performing the particular number of iterations; and in response to determining that a confidence threshold associated with decoding the symbols is satisfied, terminating the decoding of the symbols, wherein, to determine that the confidence threshold associated with decoding the symbols is satisfied before performing the particular number of iterations, the processor is configured to, for two or more iterations:

determine whether a first subset of the symbols has an associated fail check count;

in response to determining that the first subset of the symbols has no associated fail check count, configure a termination parameter associated with the first subset of the symbols to have a first value; and obtain a value of a termination parameter associated with a second subset of the symbols, and wherein, to determine that the confidence threshold associated with decoding the symbols is satisfied before performing the particular number of iterations, the processor is configured to, for two or more iterations:

compare signs of input log likelihood ratio values associated with the first subset of the symbols to signs of output log likelihood ratio values associated with the first subset of the symbols, in response to determining that the first subset of the symbols has no associated fail check count; and configure the termination parameter associated with the first subset of the symbols to have the first value in response to determining that the signs of input log likelihood ratio values associated with the first subset of the symbols are identical to the signs of output log likelihood ratio values associated with the first subset of the symbols.

15. The receiver of claim 14, wherein the decoding of the symbols is terminated before all the particular number of iterations have been performed.

16. The receiver of claim 14, wherein terminating the decoding of the symbols comprises terminating the decoding of the symbols in response to the value of the termination parameter associated with the second subset of the symbols and the value of the termination parameter associated with the first subset of the symbols being the first value.

17. The receiver of claim 14, wherein the second subset of symbols includes symbols that are received one clock cycle before the symbols in the first subset of symbols.

18. The receiver of claim 14, wherein terminating the decoding of the symbols comprises:

setting each log likelihood ratio value associated with the first subset of the symbols to a maximum value.

* * * * *